United States Patent
Beaulieu (10) Patent No.: US 7,425,713 B2
(45) Date of Patent: Sep. 16, 2008

(54) SYNCHRONOUS RASTER SCANNING LITHOGRAPHIC SYSTEM

(75) Inventor: David Beaulieu, Groton, MA (US)

(73) Assignee: Arradiance, Inc., Sudbury, MA (US)

( * ) Notice: Subject to any disclaimer, the term of this patent is extended or adjusted under 35 U.S.C. 154(b) by 143 days.

(21) Appl. No.: 11/331,545

(22) Filed: Jan. 13, 2006

(65) Prior Publication Data

US 2008/0142739 A1 Jun. 19, 2008

Related U.S. Application Data

(60) Provisional application No. 60/644,077, filed on Jan. 14, 2005.

(51) Int. Cl.
*G03F 9/00* (2006.01)
*G21K 5/10* (2006.01)

(52) U.S. Cl. .................. 250/492.2; 250/442.11; 250/491.1; 250/492.22; 250/492.3; 378/34

(58) Field of Classification Search ............ 250/442.11, 250/396 R, 397, 398, 400, 306, 307, 309–311, 250/440.11, 491.1, 492.1, 492.2, 492.21, 250/492.22, 492.23, 492.24, 492.3, 493.1, 250/494.1, 505.1; 378/34, 35, 39; 430/296
See application file for complete search history.

(56) References Cited

U.S. PATENT DOCUMENTS

| | | | |
|---|---|---|---|
| 4,796,038 A | | 1/1989 | Allen et al. |
| 5,005,138 A | * | 4/1991 | Tobuse et al. ............ 250/492.2 |
| 5,384,463 A | * | 1/1995 | Honjo et al. ................. 250/398 |
| 5,393,987 A | * | 2/1995 | Abboud et al. ......... 250/492.22 |
| 5,430,292 A | * | 7/1995 | Honjo et al. ................. 250/310 |
| 5,533,170 A | * | 7/1996 | Teitzel et al. ................. 358/1.8 |
| 5,557,105 A | * | 9/1996 | Honjo et al. ................. 250/310 |
| 5,558,884 A | * | 9/1996 | Hug et al. ................. 425/174.4 |
| 5,703,376 A | * | 12/1997 | Jensen .................... 250/492.22 |
| 5,876,902 A | * | 3/1999 | Veneklasen et al. ......... 430/296 |
| 5,900,637 A | | 5/1999 | Smith |
| 6,274,290 B1 | * | 8/2001 | Veneklasen et al. ......... 430/296 |
| 6,333,138 B1 | * | 12/2001 | Higashikawa et al. ....... 430/296 |
| 6,433,348 B1 | * | 8/2002 | Abboud et al. ......... 250/492.22 |
| 6,507,146 B2 | * | 1/2003 | Moore ......................... 313/495 |
| 6,607,863 B2 | * | 8/2003 | Irie ............................. 430/30 |

(Continued)

FOREIGN PATENT DOCUMENTS

EP 0 147 580 A1 7/1985

(Continued)

*Primary Examiner*—Bernard E Souw
(74) *Attorney, Agent, or Firm*—Kurt Rauschenbach; Rauschenbach Patent Law Group, LLC (57) ABSTRACT

A multi-beam synchronous raster scanning lithography system includes a processor that generates electrical signals representing a desired exposure pattern at an output. A multi-beam source of exposing radiation generates a plurality of exposure beam. A beam modulator receives the electrical signals generated by the processor and modulates the plurality of exposing beams according to the desired exposure pattern. A beam deflector deflects the plurality of exposure beams by a predetermined distance along a first axis, thereby exposing a plurality of pixels along the first axis with the desired exposure pattern. A translation stage moves the substrate a predetermined distance along a second axis to position the substrate for a subsequent exposure of pixels along the first axis that results in a desired overlapping exposure dose profile.

22 Claims, 9 Drawing Sheets

U.S. PATENT DOCUMENTS

| | | | |
|---|---|---|---|
| 6,614,035 B2 * | 9/2003 | Hartley | 250/492.23 |
| 6,617,587 B2 * | 9/2003 | Parker et al. | 250/398 |
| 6,803,582 B2 * | 10/2004 | Berglund | 250/396 R |
| 6,844,560 B2 | 1/2005 | Wieland et al. | |
| 6,897,458 B2 | 5/2005 | Wieland et al. | |
| 6,919,952 B2 | 7/2005 | Kruit | |
| 6,958,804 B2 | 10/2005 | Wieland et al. | |
| 7,019,312 B2 | 3/2006 | Kruit | |
| 7,019,908 B2 | 3/2006 | Van 't Spijker et al. | |
| 7,084,414 B2 | 8/2006 | Wieland et al. | |
| 7,091,504 B2 | 8/2006 | Wieland et al. | |
| 7,129,502 B2 | 10/2006 | Kruit | |
| 2003/0042434 A1 | 3/2003 | Mankos et al. | |
| 2004/0119023 A1 * | 6/2004 | Nakasuji et al. | 250/396 R |
| 2006/0060798 A1 * | 3/2006 | Miyagawa | 250/492.22 |

FOREIGN PATENT DOCUMENTS

| | | |
|---|---|---|
| WO | 2004044944 A2 | 5/2004 |

* cited by examiner

Multi Pass Simulation of Complex Imagery

SYNCHRONOUS RASTER SCANNING LITHOGRAPHIC SYSTEM

RELATED APPLICATION SECTION

This application claims priority to U.S. Provisional Patent Application Ser. No. 60/644,077, filed Jan. 14, 2005, and entitled "Synchronous Raster Scanning Lithographic System." The entire application of U.S. Provisional Patent Application Ser. No. 60/644,077 is incorporated herein by reference.

FEDERAL RESEARCH STATEMENT

This invention was made with Government support under Grant Number HR0011-05-9-0001, modification number P00003, awarded by the Defense Advanced Research Projects Agency (DARPA). The Government has certain rights in this invention.

BACKGROUND OF THE INVENTION

The section headings used herein are for organizational purposes only and should not to be construed as limiting the subject matter described in the present application.

The present invention relates generally to high throughput image formation. Many known imaging systems use single beam illumination to image complex shapes. For example, single beam illumination imaging systems are used in many products, such as cathode ray tube systems and plotters. Single beam illumination imaging systems are also used in lithographic systems for fabricating mask works for projection and contact lithography. In addition, single beam illumination imaging systems are used for direct exposure systems that write images directly on to a work piece.

Recently, multi beam imaging systems have been used to increase imaging throughput. For example, multi-beam imaging systems are currently used in high throughput dot matrix printers, ink jet printers, and laser jet printers.

DESCRIPTION OF THE DRAWINGS

The aspects of this invention may be better understood by referring to the following description in conjunction with the accompanying drawings, in which like numerals indicate like structural elements and features in various figures. The drawings are not necessarily to scale. The skilled artisan will understand that the drawings, described below, are for illustration purposes only. The drawings are not intended to limit the scope of the present teachings in any way.

DETAILED DESCRIPTION

While the present teachings are described in conjunction with various embodiments and examples, it is not intended that the present teachings be limited to such embodiments. On the contrary, the present teachings encompass various alternatives, modifications and equivalents, as will be appreciated by those of skill in the art.

For example, some aspects of the imaging system of the present invention are described in connection with lithography systems used for fabricating semiconductor devices. However, it is understood that the imaging systems of the present invention have many applications and are not limited to lithography systems. For example, the imaging systems of the present invention can be used for direct writing technologies, such as ink, thermal, and laser printing technologies and also for phosphorous screen technologies. In addition, the imaging systems of the present invention can be used with single or multi-beam (pen) systems.

It should be understood that the individual steps of the methods of the present invention may be performed in any order and/or simultaneously as long as the invention remains operable. Furthermore, it should be understood that the apparatus and methods of the present invention can include any number or all of the described embodiments as long as the invention remains operable.

The term "photosensitive material" is defined herein to mean a material that is sensitive to a particle beam. The particle beam can include any type of particles, such as photons, electrons, ions, or X-ray. The exposure time of a single pixel $T_e$ of a photosensitive material having a know sensitivity can be expressed as:

$$T_e = \frac{S_R}{E_D},$$

where $S_R$ is defined as the sensitivity of the photosensitive material (e.g. uC/cm$^2$ for electron sensitive materials and mJ/cm$^2$ for photon sensitive materials), and $E_D$ is defined as the current density of the exposure beam (e.g. A/cm² for electron beam based writing systems and mW/cm² for optical beam based writing systems).

For a single beam system, the maximum total cycle time to expose (write) a lithographic pattern in a given area can be expressed as:

$$T_C = T_e * N_{pixels},$$

where $T_e$ is the exposure time of a single pixel, and $N_{pixels}$ is the number of pixels in the exposure area. The number of pixels in the exposure area, where the required positional resolution $G_R$ is $\geq$ spot size or spot resolution ($R_{min}$) can be expressed as:

$$N_{pixels} = \frac{LW}{R_{min}^2},$$

where L is the length of the exposure area, and W is the width of the exposure area. However, when the positional resolution $G_R$, is smaller than the spot size or spot resolution $R_{min}$, such as in the case of direct write lithography, the number of potential pixels is then a function of the grid resolution and can be expressed as:

$$N_{pixels} = \frac{LW}{G_R^2}.$$

Thus for a single beam system with precise positional control requirements, the cycle time can be expressed as:

$$T_C = T_e \left( \frac{LW}{G_R^2} \right).$$

Multiple exposure beams can be used to reduce the cycle time. Multi-beam lithography systems according to the present invention use synchronous scanning architectures that move multiple beams or pens synchronously, at the same velocity. Each beam or pen can write (expose) independently. The cycle time is reduced by the number of beams $N_{beams}$ in the exposure area, which can be expressed as:

$$N_{beams} = \frac{LW}{D_{beam}^2},$$

where $D_{beam}$ is the distance between the beams assuming X and Y symmetry. The cycle time $T_C$ for multiple beams exposing a desired exposure area can be expressed as:

$$T_C = T_e \left( \frac{D_{beam}}{G_R} \right)^2 \text{ or } T_C = \frac{S_R}{E_D} \left( \frac{D_{beam}}{G_R} \right)^2.$$

Thus, where high pixel positional requirements exist, $G_R < R_{min}$, the total cycle time $T_C$ changes inversely as the square of the positional resolution $G_R$. In order to double the lithographic positional resolution in these systems (decrease $G_R$ by a factor of two) and maintain a constant cycle time $T_C$, one must either increase the current density $E_D$ by a factor of four or increase the number of beams by a factor of four.

There are, of course, practical limitations on the magnitude of the current density and the number of beams that can be implemented. These practical limitations pose a significant impediment to obtaining high throughput from multi-beam synchronous scanning lithography systems that also maintain high positional resolution.

Figure 1A:
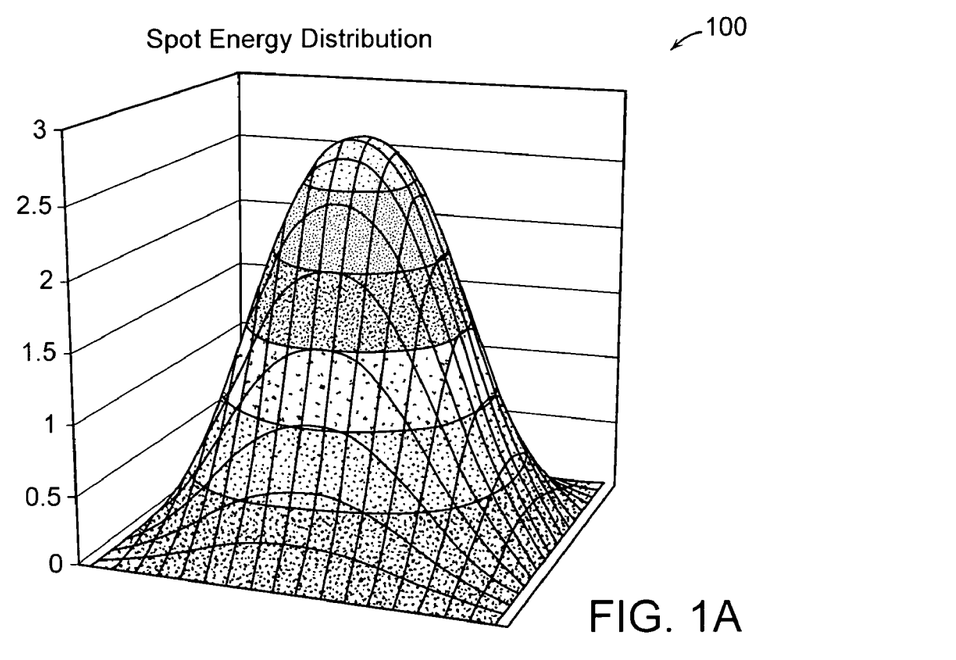
FIG. 1A is a simulation of a spot energy profile for a poorly resolved 16 nm square electron beam that is used in the simulations described herein.

An imaging system according to the present invention uses multiple exposure beams in combination with the threshold characteristics of the exposure medium to provide high image fidelity and high imaging throughput. To demonstrate the robustness of the methods and apparatus of the present invention, simulations were performed with a relatively poorly resolved spot energy. FIG. 1A is a simulation of a spot energy profile 100 for a poorly resolved 16 nm square electron beam that is used in the simulations described herein.

Figure 1B:
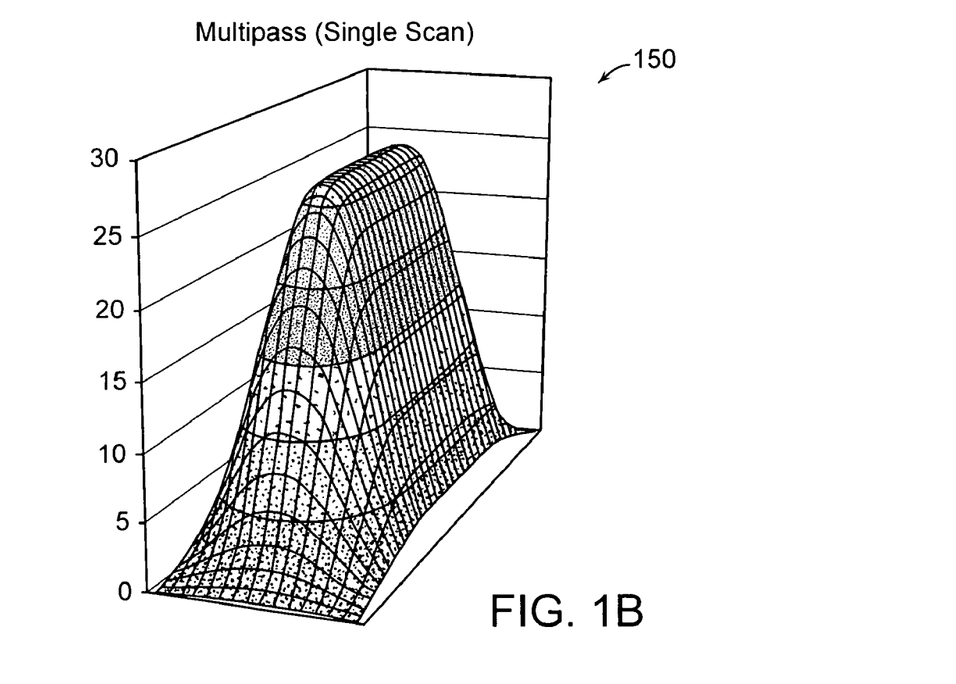
FIG. 1B is a simulation of a dose profile of the spot energy profile shown in FIG. 1A that is scanned in one direction at a constant velocity along a single axis.

FIG. 1B is a simulation of a dose profile 150 of the spot energy profile 100 shown in FIG. 1A that is scanned in one direction at a constant velocity along a single axis. The dose profile 150 was simulated for a beam that is energized for approximately three times the spot size, or 48 nm in the example presented herein. The desired final image is created by scanning the electron beam in two dimensions at increments equal to the desired grid resolution $G_R$.

Figure 2A:
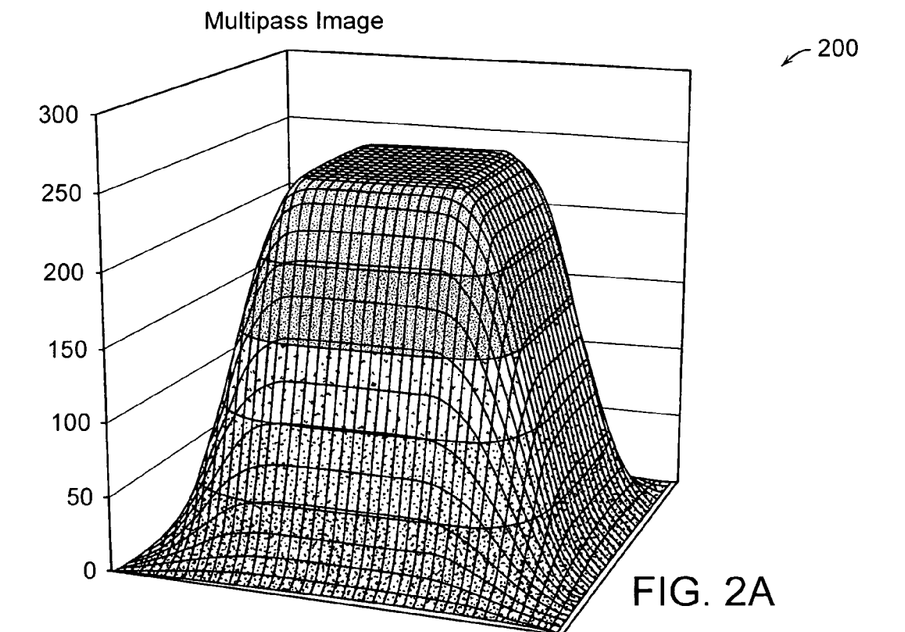
FIG. 2A is a simulation of a multi-scan dose profile of the energy profile shown in FIG. 1A that is scanned at the desired grid resolution, $G_R$, increments in two dimensions at a constant velocity along one axis according to the present invention.

FIG. 2A is a simulation of a multi-scan dose profile 200 of the energy profile 100 shown in FIG. 1A that is scanned at the desired grid resolution $G_R$ increments in two dimensions at a constant velocity along one axis according to the present invention. The electron beam is energized for approximately three times the spot size, which is 48 nm in both dimensions for the example presented herein. The simulation of the multi-scan dose profile 200 shows a high contrast dose profile, which indicates that a high contrast image can be formed.

Figure 2B:
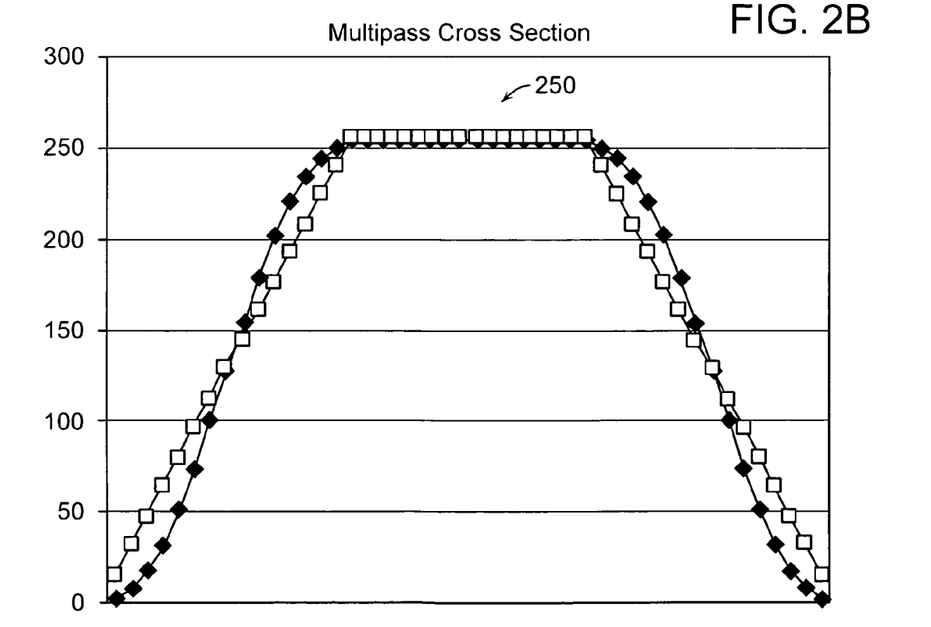
FIG. 2B is a cross section of the multi-scan dose profile shown in FIG. 2A that compares the starting energy profile shown in FIG. 1A with an ideal square wave profile.

FIG. 2B is a cross section 250 of the multi-scan dose profile 200 shown in FIG. 2A that compares the starting energy profile shown in FIG. 1A with an ideal square wave profile. The cross section 250 shown in FIG. 2B indicates that the multi-scan method of the present invention is not sensitive to the starting beam profile. This result is in contrast to properties of known scanning methods which have lithographic resolutions that are particularly sensitive to the starting beam profile.

Throughput of lithographic systems is typically a function of several parameters, such as the required dose, resolution, placement accuracy and the number of beams used in the system. Lithographic systems according to the present invention, which use multiple exposing beams and the threshold response of the developing mediums, do not have placement accuracies that depend on the system throughput. Thus, in one embodiment, a lithographic system according to the present invention uses a multi-beam source and the threshold characteristics of the exposure medium to provide significantly faster cycle time than known multi-beam lithography systems.

In one embodiment of the invention, the exposure beam is overlapped during scanning so that the total spot current density $E_D$ is increased by the number of overlapped scans (exposures) $N_P$ compared to the nominal spot resolution, where $N_P$ can be expressed as:

$$N_P = \left( \frac{R_{min}}{G_R} \right)^2.$$

Therefore, the cycle time $T_C$ of a lithographic system according to the present invention that uses multiple exposure beams and the threshold characteristics of the exposure medium can be expressed as:

$$T_C = \frac{S_R}{E_D N_p}\left(\frac{D_{beam}}{G_R}\right)^2 \text{ or } T_C = T_e\left(\frac{D_{beam}}{R_{min}}\right)^2 \text{ or } T_C = \frac{S_R}{E_D}\left(\frac{D_{beam}}{R_{min}}\right)^2.$$

Thus, the cycle time $T_C$ of lithographic systems using the multi-beam method of the present invention is inversely proportional to the square of the spot size or spot resolution $R_{min}$ and is independent of the positional grid requirement. The spot size or spot resolution $R_{min}$ is typically much larger than the grid resolution $G_R$. Therefore, the cycle time $T_C$ of lithographic systems using the multi-beam method of the present invention is significantly less than prior art lithography systems. The reduction in cycle time $T_C$ is achieved in part because the total dose to fully expose a given position is achieved with overlapping exposure beams.

The following example illustrates the reduction in cycle time $T_C$ which can be achieved by using the multi-beam method according to the present invention. The cycle time $T_C$ of a known scanning method of exposing a resist having a resist sensitivity $S_R$ equal to 10 uC/cm2, a current density $E_D$ equal to 100 A/cm2, a spot size $R_{min}$ equal to 0.025 um, and a minimum placement resolution $G_R$ equal to 0.002 um is equal to 7,812 seconds (0.46 cycles per hour). In contrast, the cycle time $T_C$ using a multi-beam method according to the present invention with the same parameters is 50 seconds (72 cycles per hour). Thus, lithographic systems using the multi-beam method of the present invention can achieve a throughput that compares with the throughput of lithographic systems that have the minimum placement resolution $G_R$ equal to the spot size $R_{min}$.

In addition to reducing the cycle time $T_C$, lithography systems of the present invention can use synchronous scanning to provide smooth blending of fields. The synchronous scanning also can be used to reduce the effects of noise, asymmetry, aberrations, and other defects in the beam that can be present in the writing spot (pen). Furthermore, the synchronous scanning of the present invention can be used to provide dose control.

Figure 3A:
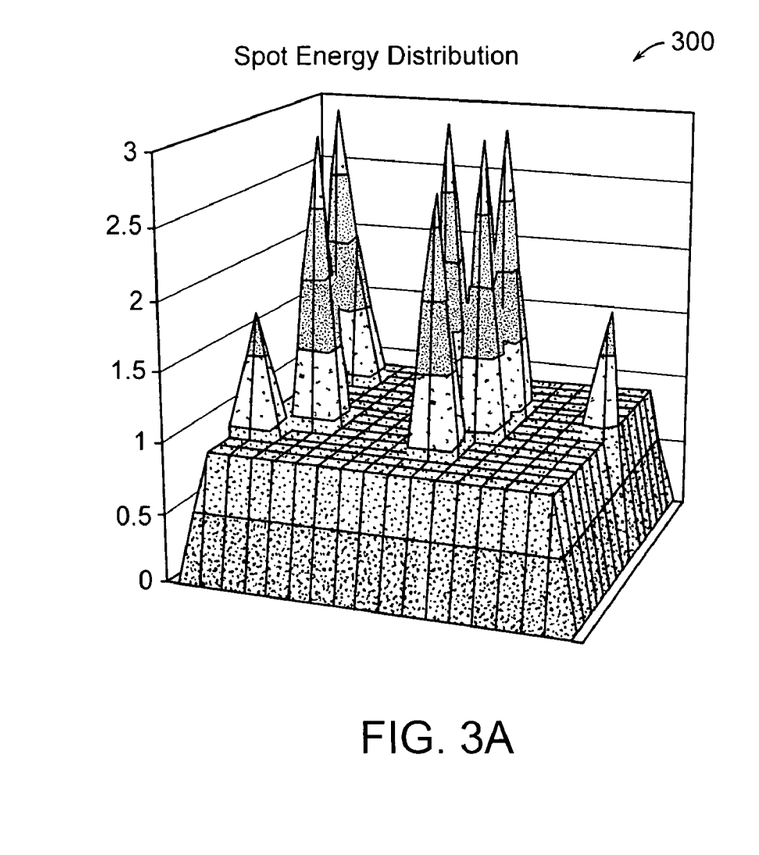
FIG. 3A illustrates a spot energy distribution of a poor quality writing beam that would not be suitable for high resolution applications in known lithography systems.
Figure 3B:
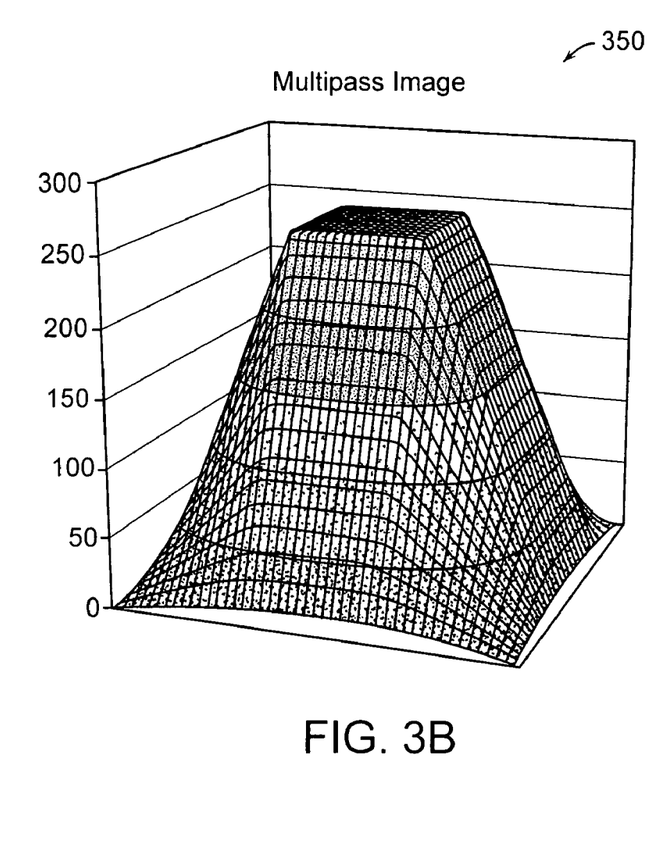
FIG. 3B illustrates a simulation of a multi-scan dose profile using the spot energy distribution shown in FIG. 3A.

FIG. 3A illustrates a spot energy distribution 300 of a poor quality writing beam that would not be suitable for high resolution applications in known lithography systems. FIG. 3B illustrates a simulation of a multi-scan dose profile 350 using the spot energy distribution 300 shown in FIG. 3A. The simulation of the multi-scan dose profile 350 indicates that a well formed energy density profile can be achieved by using the method of performing multiple scans according to the present invention.

Figure 4A:
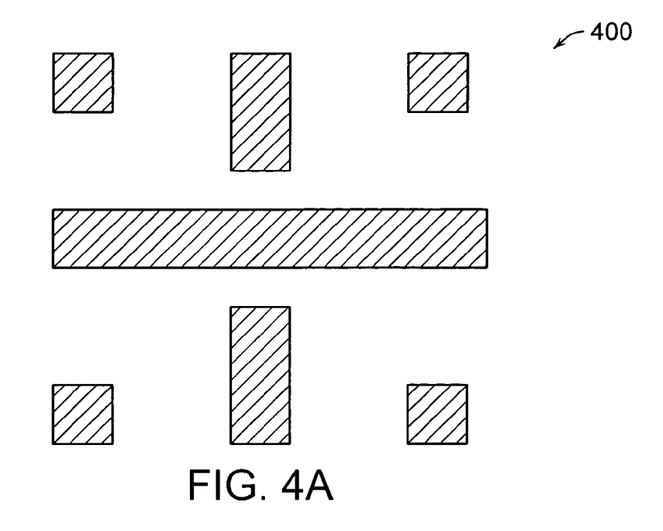
FIG. 4A illustrates an exposure pattern that facilitates dose blending.
Figure 4B:
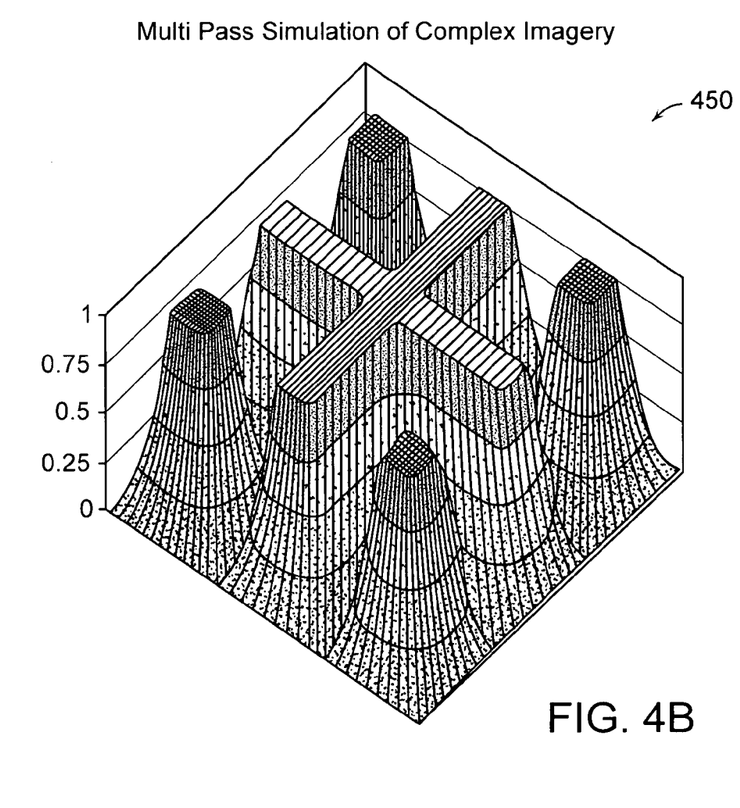
FIG. 4B illustrates a simulation of a multi-scan energy density profile that indicates blending of dose profiles in the exposure pattern shown in FIG. 4A.

In one embodiment of the invention, dose profiles overlap forming a blended dose profile. Complex images can be formed by blending dose profiles. Also, stitching and/or merging of patterns that cross boundaries between each beam in a multi beam system can be facilitated by blending dose profiles. FIG. 4A illustrates an exposure pattern 400 that facilitates dose blending. FIG. 4B illustrates a simulation of a multi-scan energy density profile 450 that indicates blending of dose profiles in the exposure pattern shown in FIG. 4A. The simulation of the multi-scan energy density profile 450 shown in FIG. 4B indicates blending of the cross patterns that produces a complex continuous dose profile that is difficult or impossible to achievable with known lithography systems.

Figure 5A:
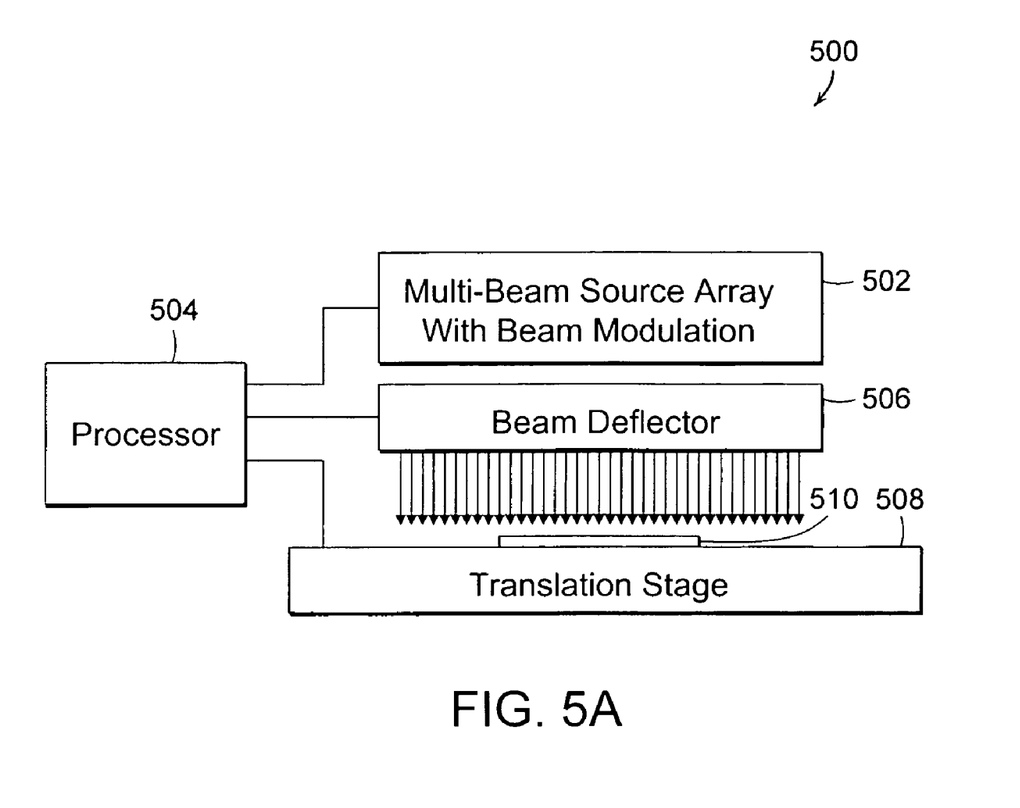
FIG. 5A illustrates a block diagram of a synchronous scanning multi-beam lithography apparatus according to the present invention.

FIG. 5A illustrates a block diagram of a synchronous scanning multi-beam lithography apparatus 500 according to the present invention. A source array 502 includes beam generating columns arranged on predetermined centers that generate a plurality of beams of exposing radiation. The source array 502 can generate multiple beams of any type of exposing radiation including optical beams, electron beams, ion beams, and X-ray beams. The number of desired beams generated by the source array 502 is determined by the desired area to be lithographically defined or printed with the exposing radiation.

A plurality of beam modulators modulates at least some of the plurality of exposure beams. In some embodiments, the source array 502 includes the plurality of beam modulators as indicated in FIG. 5A and as described in connection with the multi-electron beam source 800 shown in FIG. 8. In many embodiments, each of the plurality of beams of exposing radiation is modulated by one of a plurality of beam modulators.

In many embodiments, the synchronous multi-beam lithography apparatus 500 includes a processor 504 or data generator having outputs that are electrically connected to control inputs of the plurality of beam modulators. The processor 504 or data generator generates electrical signals that instruct the plurality of beam modulators to modulate the plurality of beams of exposing radiation according to a desired exposure pattern.

The block diagram 500 also shows a synchronous beam deflector 506 that simultaneously deflects all beams in the Y-axis direction (shown in FIG. 5B) by a predetermined distance. In many embodiments, the synchronous beam deflector 506 simultaneously deflects all beams in the Y-axis direction at a constant velocity. In many embodiments, the processor 504 or data generator includes at least one output that is electrically connected to a control input of the beam deflector 506. The processor 504 controls the timing of the beam deflection.

Figure 5B:
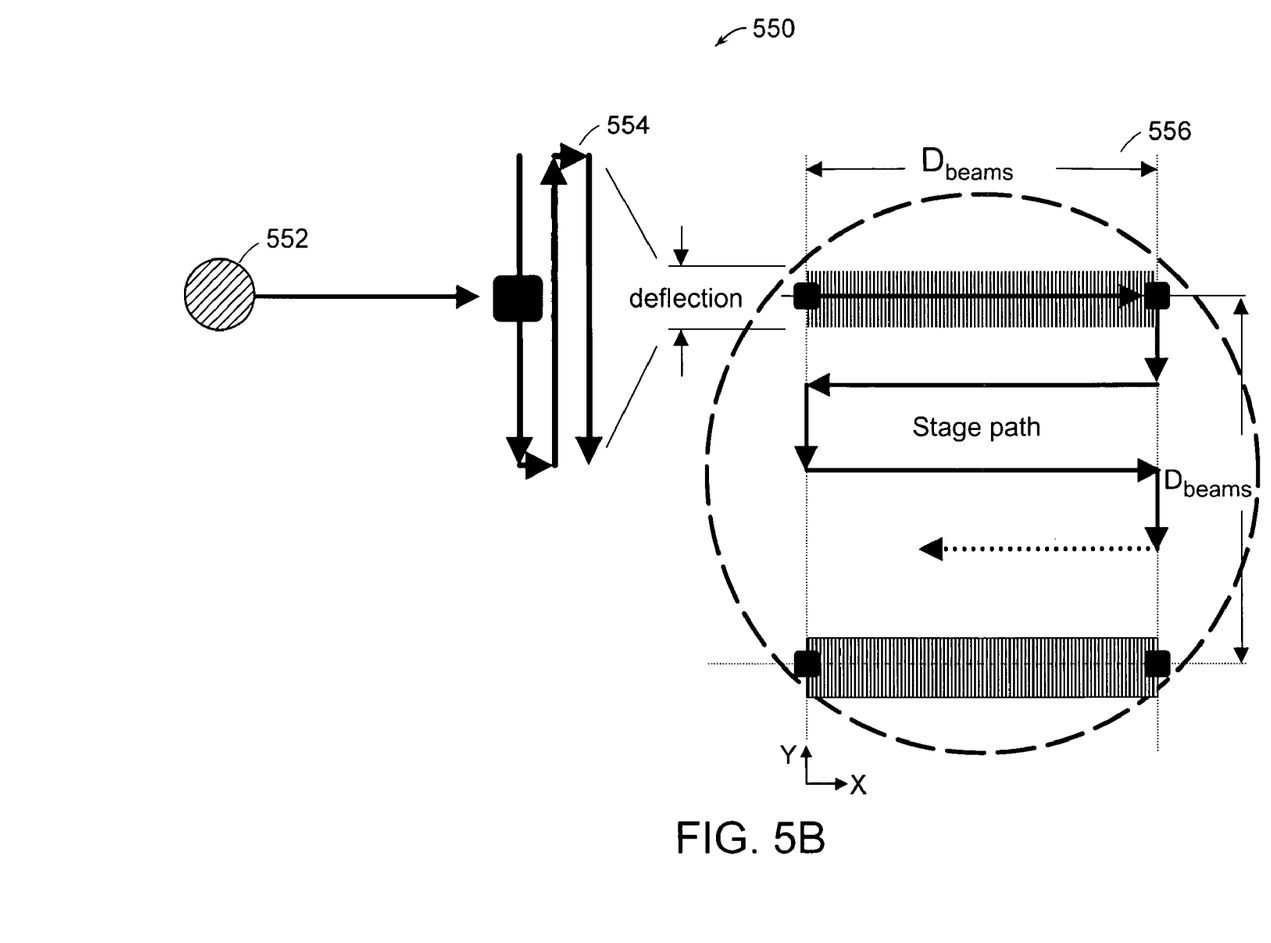
FIG. 5B illustrates a schematic representation of the operation of the synchronous scanning multi-beam lithography apparatus shown in FIG. 5A.

In addition, the block diagram 500 shows a synchronous translation stage 508 where the substrate 510 or workpiece being exposed to the exposure beams is moved in the X-axis direction (shown in FIG. 5B). In many embodiments, the substrate 510 or workpiece being exposed to the exposure beams is moved in the X-axis direction at a constant velocity. In many embodiments, the processor 504 or data generator includes an output that is electrically connected to a control input of the synchronous translation stage 508. The processor 504 controls the timing of the synchronous stage 508 scanning shown in FIG. 5B.

FIG. 5B illustrates a schematic diagram 550 of the operation of the synchronous scanning multi-beam lithography apparatus shown in FIG. 5A. For the purpose of illustrating the invention, the schematic diagram 550 shows a single optical beam 552 being asynchronously modulated (write/no-write) during the lithography process. The schematic diagram 550 also shows synchronous beam deflection 554 where the single optical beam 552 is synchronously deflected by a predetermined distance in the Y-axis direction by the beam deflector 506. In many embodiments, the optical beams are synchronously deflected by the predetermined distance at a constant velocity.

In addition, the schematic diagram 550 shows synchronous stage translation or scanning 556 where the substrate 510 or workpiece being exposed to the exposure beams is moved along the X-axis direction. In many embodiments, the substrate 510 is moved along the X-axis direction at a constant velocity.

For example, the exposure beams in the source array 502 can be arranged on a 500 μm grid center (i.e. $D_{beam}$=500 μm) and can be simultaneously deflected in the Y-axis direction by 5 μm at a constant velocity with the beam deflector 506. A 5 μm×500 um exposure is performed for all beams after the translation stage 508 has traveled 500 um. This process is repeated by subsequent Y-axis direction stage motions of 5 μm microns, until each pixel in the desired exposure pattern is exposed. The entire area is exposed (written) simultaneously.

Figure 6:
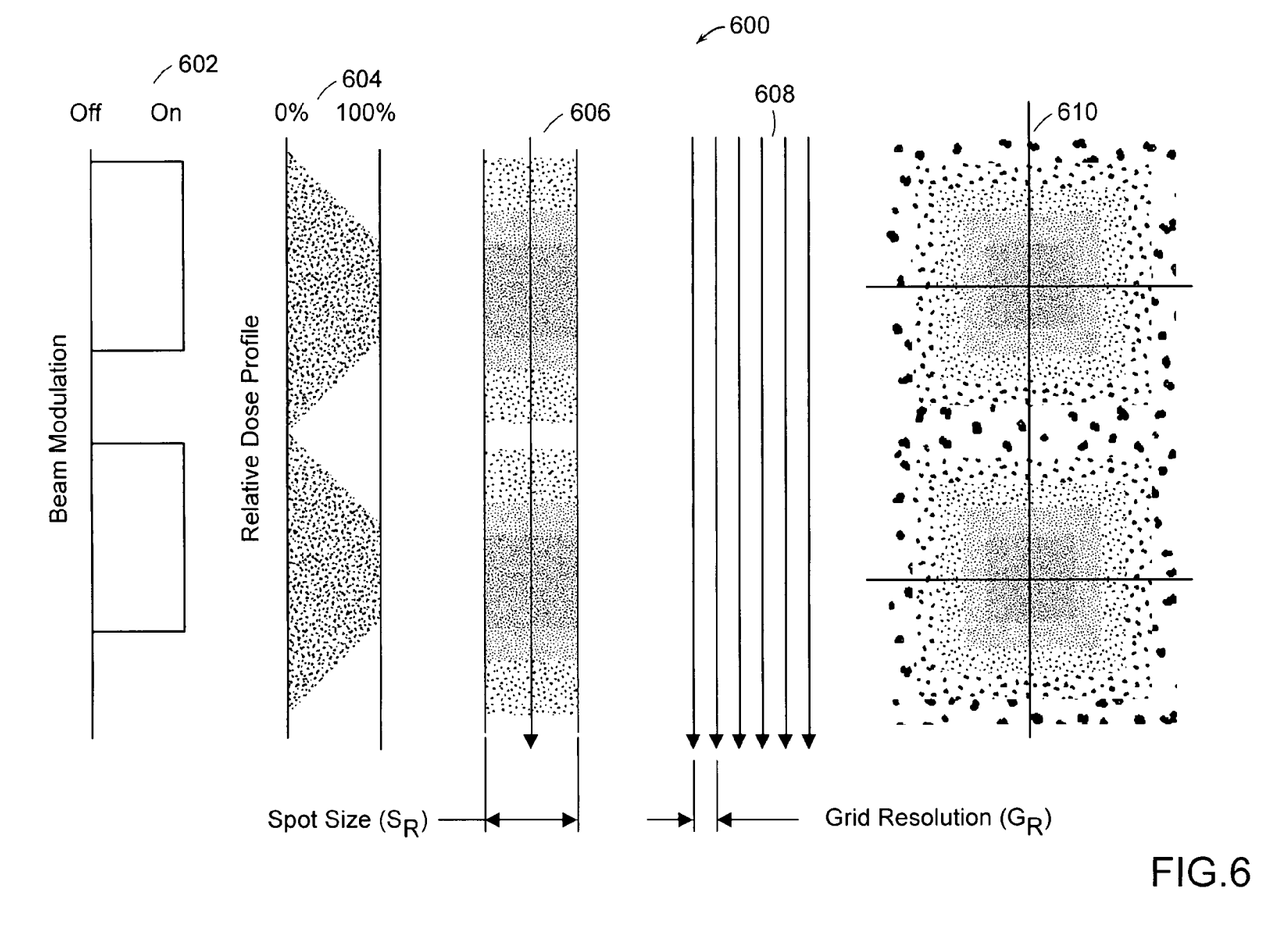
FIG. 6 is a schematic diagram illustrating the sequencing of a single beam multi-scan writing operation that forms two images in a photosensitive material according to the present invention.

FIG. 6 is a schematic diagram 600 illustrating the sequencing of a single beam multi-scan writing operation that forms two images in a photosensitive material according to the present invention. The schematic diagram 600 shows the beam modulation 602 in the "on" and in the "off" state. The schematic diagram 600 also shows the relative dose profile 604 from 0-100%. In addition, the schematic diagram 600 shows the resulting single scan image 606 having the beam of spot size $S_R$.

In addition, the schematic diagram 600 shows multiple overlapping scans 608. The dose threshold is reached by energizing and de-energizing the beam for a predetermined length of time while the beam is moving during the overlapping scans relative to the substrate or workpiece in one axis. The multiple overlapping scans are produced by translating the beam of spot size $S_R$ relative to a substrate in the X and Y directions. The exposures are repeatedly overlapped at increments of the positional resolution $G_R$. The resultant image has an area of the spot size $S_R$ which has reached the threshold 100% dose level of the photosensitive material. One skilled in the art can appreciate that any geometry can be created by changing both the beam modulation in one axis and the length of overlap in the other axis.

Figure 7:
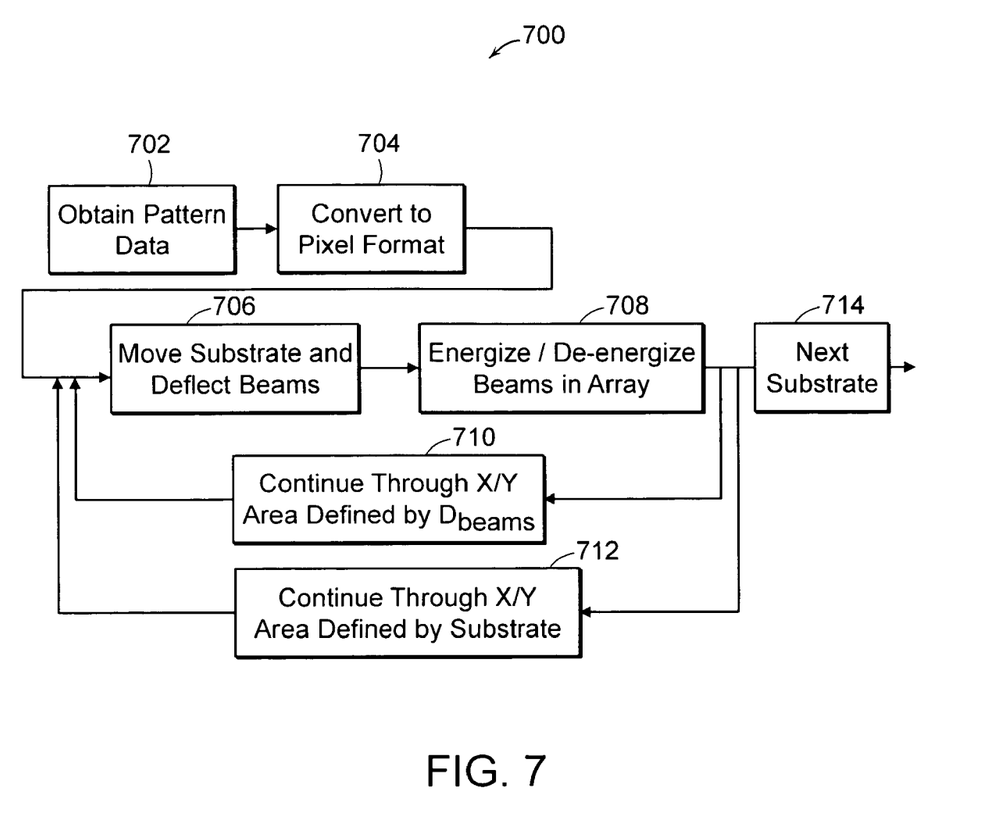
FIG. 7 illustrates a flowchart of a method of performing synchronous multi-beam lithography according to the present invention.

FIG. 7 illustrates a flowchart 700 of a method of performing synchronous multi-beam lithography according to the present invention. In a first step 702, the data for the pattern to be written to the entire substrate or workpiece is obtained. In a second step 704, the data is converted into a desired pixel format. The desired pixel format is one in which the data can be interpreted and used for defining the writing sequence of the multi-beams of exposing radiation. In a third step 706, the substrate is moved into position relative to the multi-beam array.

In a fourth step 708, each of the exposure beams is energized or de-energized to write data in the individual pixels. In the fifth step 710, the method is repeated for the next position until the area between the beams of dimension $D_{beams}$ is exposed to the energized or de-energized beams. In the sixth step 712, the method is repeated over the entire area defined by the substrate. In the seventh step 714, the entire method is repeated for the next substrate. One skilled in the art will appreciate that the layout of the beams, size of the source array, and relative substrate motions can be optimized for a particular application.

Figure 8:
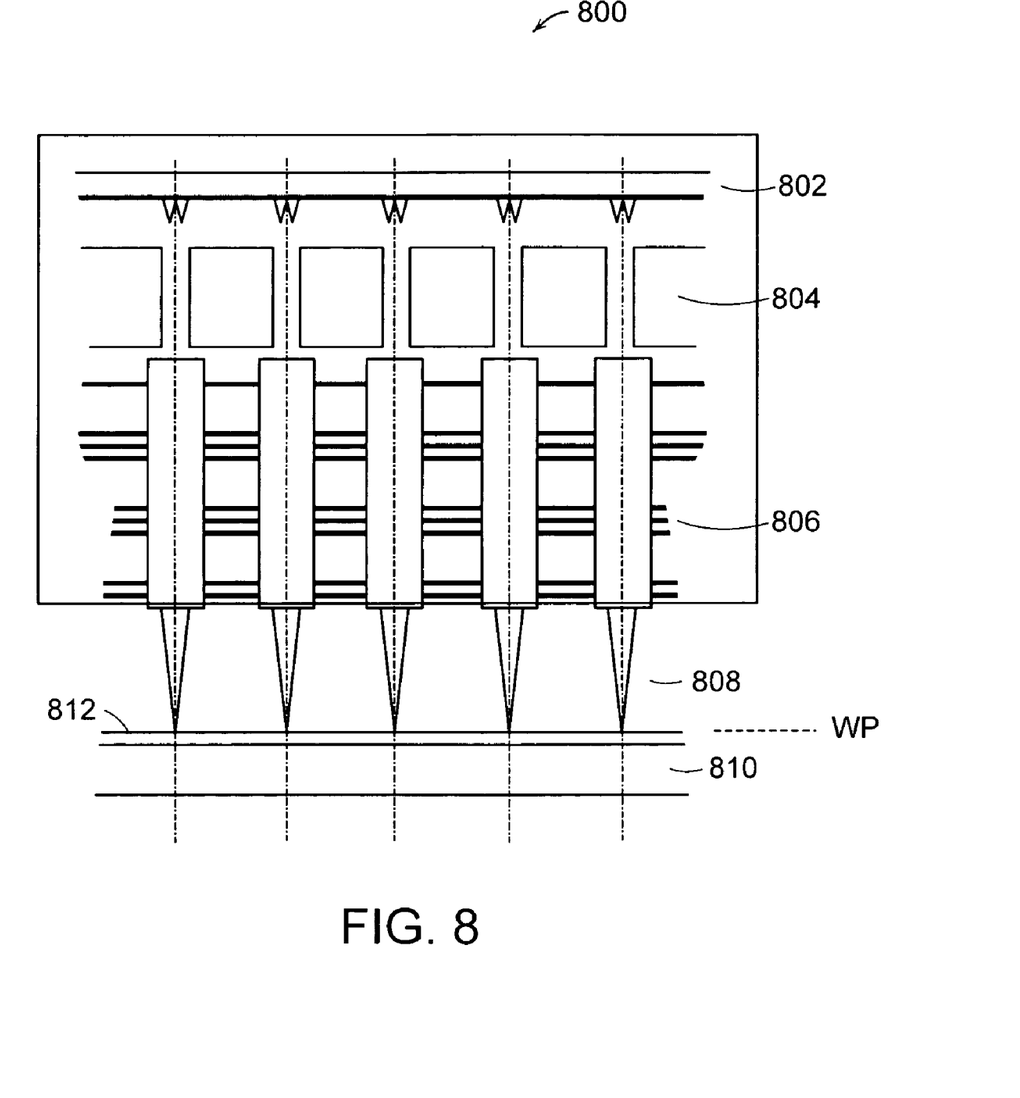
FIG. 8 illustrates an embodiment of a multi-electron beam source for performing synchronous raster scanning lithography according to the present invention.

FIG. 8 illustrates an embodiment of a multi-electron beam source 800 for performing synchronous raster scanning lithography according to the present invention. The multi-electron beam source 800 includes a field emission array 802 that emits a plurality of electron beams for exposing an electron beam sensitive material. In the embodiment shown, the field emission array 802 is a cluster of one or more tips that can be individually energized to emit the plurality of electrons. A secondary electron multiplication array 804 is positioned in the path of the electrons generated by the field emission array 802.

An output of the field emission array 802 is focused by an electrostatic lens array 806, which forms an array of focused beams 808. In some embodiments, the electrostatic lens array 806 also deflects the array of focused beams 808 in at least one of the X-axis and the Y-axis directions at the WP plane as shown in the figure. The array of focused beams 808 is directed onto a substrate 810 having a top surface coated with a photosensitive material 812. In one embodiment, the array of focused beams 808 is a two-dimensional array. Using a two-dimensional array will increase the number of beams in a particular source area and thus, will increase lithographic throughput. One skilled in the art will appreciate that the image forming and scanning technique described herein can be applied to numerous other devices.

EQUIVALENTS

While the present teachings are described in conjunction with various embodiments and examples, it is not intended that the present teachings be limited to such embodiments. On the contrary, the present teachings encompass various alternatives, modifications and equivalents, as will be appreciated by those of skill in the art, may be made therein without departing from the spirit and scope of the invention as defined by the appended claims.

What is claimed is:

1. A multi-beam synchronous raster scanning lithography system comprising:
   a) a processor that generates electrical signals representing a desired exposure pattern at an output;
   b) a multi-beam source of exposing radiation that generates a plurality of exposure beam;
   c) a beam modulator having control inputs that are electrically connected to the output of the processor, the beam modulator receiving the electrical signals generated by the processor and modulating the plurality of exposing beams according to the desired exposure pattern;
   d) a beam deflector that deflects the plurality of exposure beams by a predetermined distance along a first axis, thereby exposing a plurality of pixels along the first axis with the desired exposure pattern; and
   e) a translation stage that supports a substrate to be exposed, the translation stage moving the substrate a predetermined distance along a second axis to position the substrate for a subsequent exposure of pixels along the first axis that results in a desired overlapping exposure dose profile, wherein a cycle time $T_C$ is inversely proportional to the square of a spot resolution $R_{min}$ and is independent of a positional grid of the multi-beam synchronous raster scanning lithography system.

2. The system of claim 1 wherein the multi-beam source of exposing radiation comprises a two-dimensional array multi-beam source.

3. The system of claim 1 wherein the multi-beam source of exposing radiation comprises a multi-electron beam source that generates a plurality of electron beams.

4. The system of claim 1 wherein the multi-beam source of exposing radiation comprises a field emission array comprising a plurality individually addressable electron emitters that emit a plurality of electron beams.

5. The system of claim 4 further comprising a secondary electron multiplication array that is positioned in a path of the plurality of electron beams emitted from the field emission array, the secondary electron multiplication array generating a plurality of focused electron beams.

6. The system of claim 4 wherein the beam deflector further comprises an electrostatic lens array that deflects the plurality of electron beams.

7. The system of claim 1 wherein the beam deflector comprises a control input that is electrically connected to the output of the processor, the processor generating a signal that instructs the beam deflector to deflect the plurality of exposure beams by a predetermined distance along a first axis that results in the desired overlapping exposure dose profile.

8. The system of claim 1 wherein the translation stage comprises a control input that is electrically connected to the output of the processor, the processor generating a signal that instructs the translation stage to move the substrate a distance along the second axis that results in the desired overlapping exposure dose profile.

9. The system of claim 1 wherein the predetermined distance along the second axis is less than a beam resolution of the system.

10. A method of synchronous raster scanning lithography, the method comprising:
   a) generating a plurality of exposure beams;
   b) modulating the plurality of exposure beams according to a first lithography pattern;
   c) deflecting the modulated plurality of exposure beams a predetermined distance along a first axis, thereby exposing a plurality of pixels at a first substrate position along the first axis with the first lithography pattern;
   d) translating the substrate a predetermined distance along a second axis to a second substrate position;
   e) modulating the plurality of exposure beams according to a second lithography pattern; and
   f) deflecting the modulated plurality of exposure beams a predetermined distance along the first axis, thereby exposing a plurality of pixels at the second substrate position along the first axis with the second lithography pattern, wherein at least one of the predetermined distance that the modulated plurality of exposure beams is deflected along the first axis and the predetermine distance that the substrate is translated along the second axis is chosen to achieve a desired total exposure dose profile for each of the plurality of pixels exposed along the first axis on the substrate and wherein a cycle time $T_C$ is inversely proportional to the square of a spot resolution $R_{min}$ and is independent of a positional grid.

11. The method of claim 10 wherein the generating a plurality of exposure beams comprises generating the plurality of exposure beams in two dimensions.

12. The method of claim 10 wherein the generating the plurality of exposing beams comprises generating a plurality of electron beams.

13. The method of claim 10 wherein the desired total exposure dose for each of the plurality of pixels exposed along the first axis on the substrate comprises an overlapping exposure dose.

14. The method of claim 10 wherein the modulated plurality of exposure beams is deflected by the predetermined distance along the first axis at a constant velocity.

15. The method of claim 10 wherein the substrate to be exposed is translated the predetermined distance along the second axis at a constant velocity.

16. The method of claim 10 wherein the second axis is perpendicular to the first axis.

17. The method of claim 10 wherein the desired total exposure dose for each of the plurality of pixels exposed along the first axis on the substrate comprises a blended dose profile.

18. The method of claim 10 further comprising adjusting at least one of the predetermined distance that the modulated plurality of beams is deflected along the first axis and the predetermine distance that the substrate is translated along the second axis to reduce effects of aberrations in the modulated plurality of beams.

19. The method of claim 10 further comprising generating instructions for modulating the plurality of beams according to the first and the second desired lithography pattern.

20. The method of claim 10 further comprising repeating the steps of deflecting the modulated plurality of exposure beams and translating the substrate until the desired lithographic pattern is exposed in a desired area of the substrate.

21. The method of claim 10 further comprising:
   a) translating the substrate a predetermined distance along the second axis to a third substrate position;
   b) modulating the plurality of exposure beams according to a third desired lithography pattern; and
   c) deflecting the modulated plurality of exposure beams a predetermined distance along the first axis, thereby exposing a plurality of pixels at the third substrate position along the first axis with the third desired lithography pattern,
   wherein at least one of the predetermined distance that the modulated plurality of exposure beams is deflected along the first axis and the predetermine distance that the substrate is translated along the second axis is chosen to achieve a desired total exposure dose for each of the plurality of pixels exposed along the first axis on the substrate.

22. A method of synchronous raster scanning lithography, the method comprising:
   a) generating a plurality of exposure beams that are modulated according to a first lithography pattern;
   b) deflecting the plurality of modulated exposure beams a predetermined distance along a first axis, thereby exposing a plurality of pixels at a first substrate position along the first axis;
   c) generating a second plurality of exposure beams that are modulated according to a second lithography pattern; and
   d) deflecting the plurality of modulated exposure beams a predetermined distance along the first axis, thereby exposing a plurality of pixels at a second substrate position along the first axis, wherein the exposures of the plurality of pixels at the first and the second substrate positions overlap so as to increase imaging throughput so that a cycle time $T_C$ is inversely proportional to the square of a spot resolution $R_{min}$ and is independent of a positional grid.

* * * * *